(12) United States Patent
Vollrath et al.

(10) Patent No.: US 6,304,479 B1
(45) Date of Patent: Oct. 16, 2001

(54) SHIELDED BIT LINE ARCHITECTURE FOR MEMORY ARRAYS

(75) Inventors: Joerg Vollrath, Richmond; Michael Fera, Glen Allen; Philip Moore, Richmond, all of VA (US)

(73) Assignees: Infineon Technologies North America Corp., San Jose, CA (US); Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/602,758

(22) Filed: Jun. 23, 2000

(51) Int. Cl.[7] .................................................. G11C 5/06
(52) U.S. Cl. ............................................. 365/63; 365/206
(58) Field of Search .............................. 365/63, 206, 190, 365/149, 154, 220

(56) References Cited

U.S. PATENT DOCUMENTS

| | | | | |
|---|---|---|---|---|
| 4,922,459 | * | 5/1990 | Hidaks | 365/206 |
| 4,958,325 | * | 9/1990 | Nakagome et al. | 365/206 |
| 5,091,887 | * | 2/1992 | Asakara | 365/206 |
| 5,475,643 | * | 12/1995 | Uhta | 365/206 |
| 5,555,203 | * | 9/1996 | Shiratake et al. | 365/206 |
| 5,818,773 | * | 10/1998 | Takashisa | 365/206 |
| 5,917,745 | * | 6/1999 | Fujji | 365/206 |
| 6,002,625 | * | 12/1999 | Ahn | 365/206 |

FOREIGN PATENT DOCUMENTS

405041081 * 2/1993 (JP) ............................ 365/207

\* cited by examiner

*Primary Examiner*—Tan T. Nguyen
(74) *Attorney, Agent, or Firm*—Stanton C. Braden

(57) ABSTRACT

A memory array, in accordance with the invention, includes a plurality of memory cells disposed in an array. A plurality of bitlines are included for reading and writing data to and from the memory cells. The plurality of bitlines include a first group of bitlines and a second group of bitlines. Each bitline of the first group is interposed between bitlines of the second group, and each bitline of the second group is interposed between bitlines of the first group. The first group of bitlines are active when the second group of bitlines are inactive, and the second group of bitlines are active when the first group of bitlines are inactive such that adjacent inactive bitlines provide a shield to prevent cross-coupling between active bitlines.

19 Claims, 4 Drawing Sheets

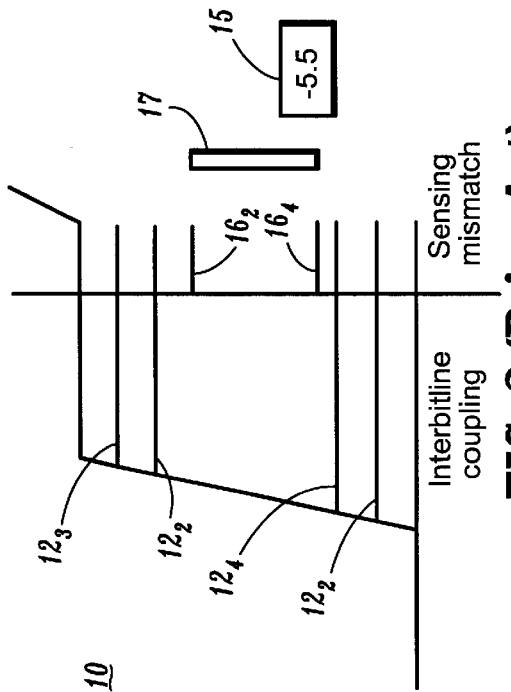
FIG. 2 (Prior Art)
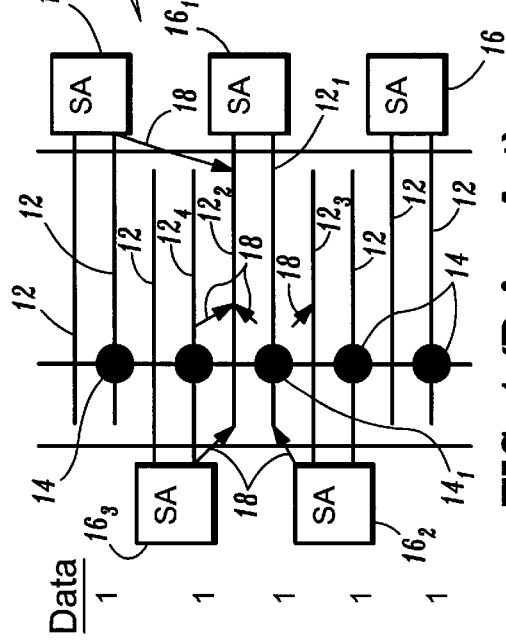
FIG. 1 (Prior Art)
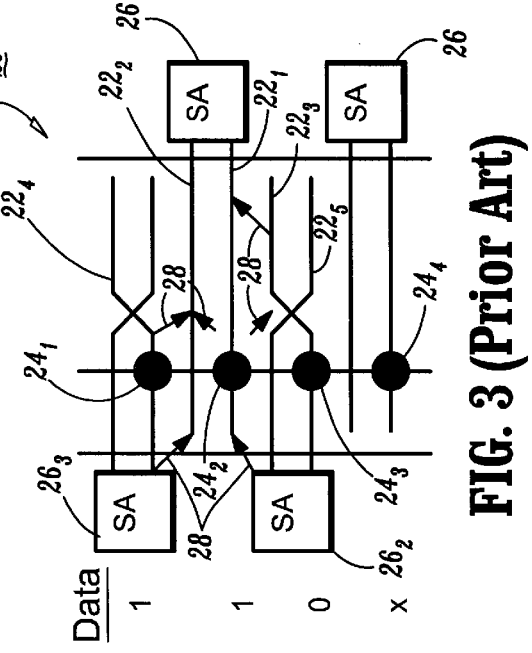
FIG. 4 (Prior Art)
FIG. 3 (Prior Art)

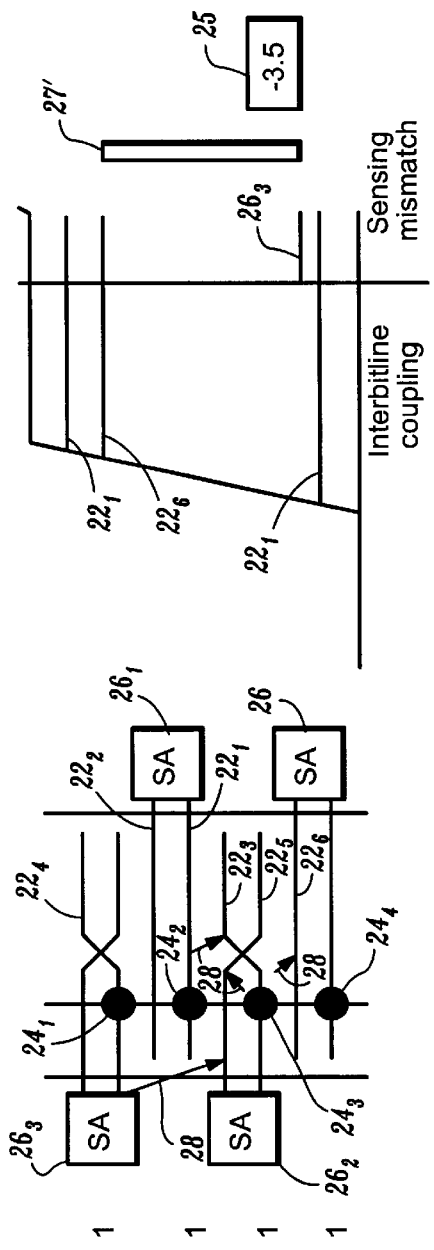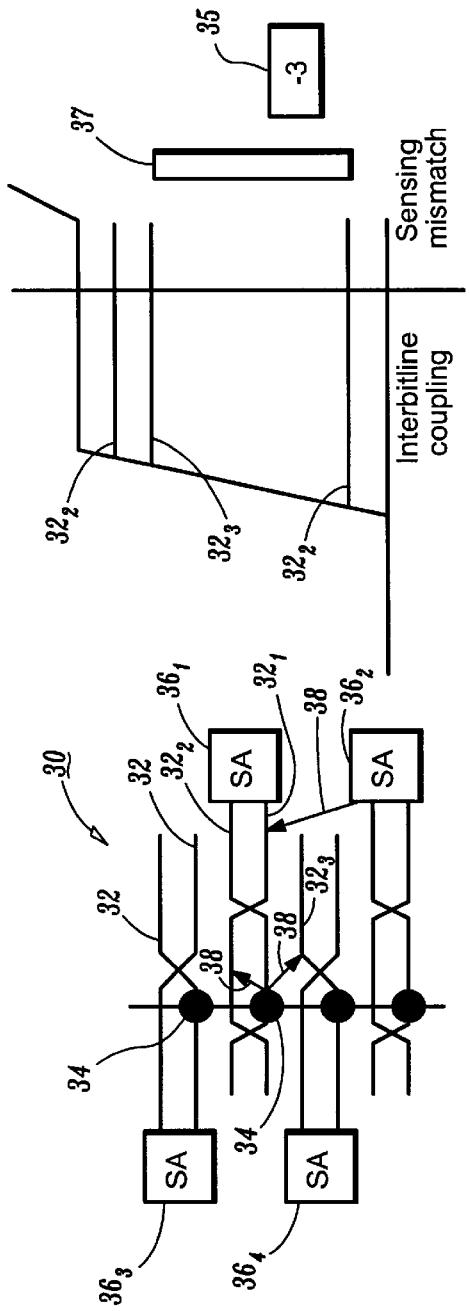
FIG. 5 (Prior Art)
FIG. 6 (Prior Art)
FIG. 7 (Prior Art)
FIG. 8 (Prior Art)

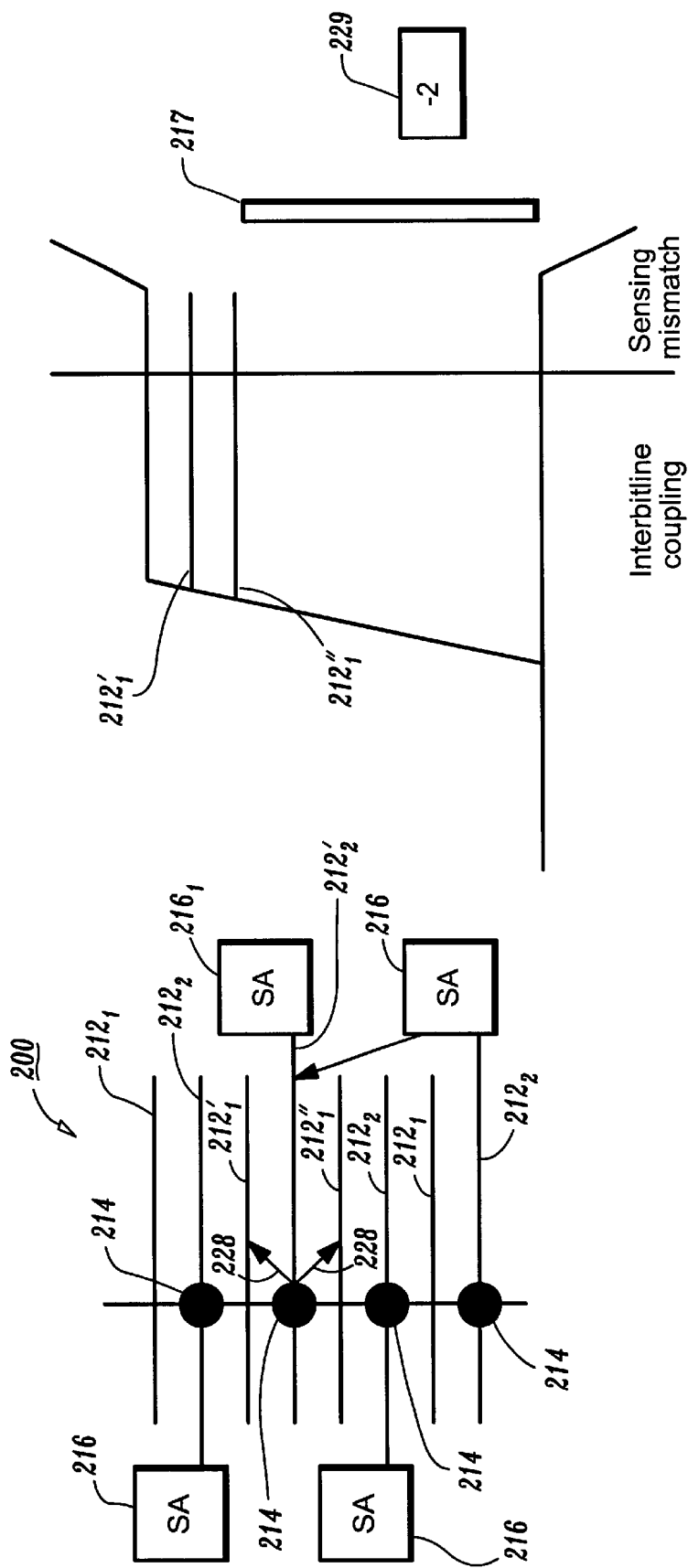

SHIELDED BIT LINE ARCHITECTURE FOR MEMORY ARRAYS

BACKGROUND

1. Technical Field

This disclosure relates to architectures of memory arrays and more particularly, to a shielded bit line architecture to reduce signal coupling to adjacent bitlines in a memory array.

2. Description of the Related Art

Semiconductor memories include bitlines, which are connected to memory cells to read and write data to the memory cell. The impetus for higher density devices has made the elimination of cross-talk or cross-coupling between bitlines an even more challenging task. Referring to FIG. 1, a layout of a conventional folded bitline architecture 10 is shown. Architecture 10 includes a plurality of sense amplifiers SA each for sensing two bitlines 12. Memory cells 14 store data, and in this example, all memory cells 14 store a "1", as indicated in the "Data" column of FIG. 1. During a read, a cell signal on bitline $12_1$ is attenuated by cross-coupling to both adjacent bit lines $12_2$ and $12_3$. This reduces the differential signal of the sense amplifier $16_1$.

As indicated in FIG. 1, considering bitline $12_1$, cross-coupling influences, shown by arrows 18, effect the data read from memory cell $14_1$ on bitlines $12_1$ and $12_2$. Surrounding components such as adjacent bitlines $12_3$ and $12_2$ as well as sense amplifiers $16_2$, $16_3$ and $16_4$, all effect the signal on bitline $12_1$. Bitlines $12_3$ and $12_2$ experience inter bitline cross-coupling, while sense amplifiers $16_2$, $16_3$ and $16_4$ affect the signal on bitline $12_1$ due to sensing mismatches (also capacitive coupling) caused by attempting to read "1"s from nearby memory cells. Sense amplifier $16_3$ influences are negligible.

Referring to FIG. 2, an illustrative diagram is shown for quantifying the effects of surrounding components on a signal on bitline $12_1$. Each line labeled in FIG. 2 represents the effect on voltage that each corresponding component of FIG. 1 has on the signal on bitline $12_1$. Taken from the perspective of bitline $12_1$, surrounding components influence a signal to be sensed by sense amplifier $16_1$ on bitline $12_1$. Sense amplifier $16_1$ sees effects due to bitlines $12_3$, $12_4$, and $12_2$ (FIG. 2 shows two influences on bitline $12_1$, one from inactive bitline $12_2$ and one due to the influences of active bitline $12_4$ through bitline $12_2$). Sense amplifier $16_1$ therefore sees a relative loss of −5.5 as indicated in box 15. This relative term is a multiplier, which represents a multiple of a coupling percent. A bar 17 is indicated showing the relative differential measured by sense amplifier $16_1$ due to the coupling effects an sensing mismatches. For example, if cross coupling loss is 5% for each component adjacent to bitline $12_1$, a signal loss of 27.% (−5.5 times 5%) is experienced. In architecture 10, relatively high coupling losses are experienced.

Referring to FIG. 3, a twisted bitline architecture 20 is shown. Architecture 20 includes a plurality of sense amplifiers SA each for sensing two bitlines 22. Memory cells 24 store data, and in this example, memory cells $24_1$ and $24_2$ store a "1". Memory cell $24_3$ stores a "0" and $24_4$ can be a "1" or a "0". During sensing if one bitline associated with a sense amplifier 26 goes up, and the other goes down the charge is equally distributed to the next line and there is no net effect to the next adjacent bitline. However, if only one line is pulled up and the other stays at the same level, some signal is coupled which disturbs the next adjacent cell. In FIG. 3, signal is coupled to adjacent bitlines 22 and sense amplifiers 26 from bitline $22_1$. During a read, a cell signal on bitline $22_1$ is attenuated by cross-coupling to adjacent bit lines $22_2$, $22_3$ $22_4$ and $22_5$ and to sense amplifiers $26_2$ and $26_3$.

As indicated in FIG. 3, considering bitline $22_1$, cross-coupling influences 28 affect the data read from memory cell $24_1$ on bitlines $22_1$ and $22_2$. Surrounding components such as adjacent bitlines $22_3$ and $22_2$ as well as sense amplifiers $26_2$, $26_3$ and $26_4$, all effect the signal on bitline $22_1$. Bitlines $22_3$ and $22_2$ experience inter-bitline cross-coupling, while sense amplifiers $26_2$ affects the signal on bitline $22_1$ due to sensing mismatches (also capacitive coupling). Sense amplifier $26_3$ influences are negligible.

Referring to FIG. 4, an illustrative diagram is shown for quantifying the effects of surrounding components on a signal on bitline $22_1$. Each line labeled in FIG. 4 represents the effect on voltage that each corresponding component of FIG. 3 has on the signal on bitline $22_1$. Sense amplifier $26_1$ therefore sees a relative loss of −4.5, as indicated in box 25. This relative term is a multiplier, which represents a multiple of a coupling percent. A bar 27 is indicated showing the relative differential measured by sense amplifier $26_1$ due to the coupling effects an sensing mismatches. For example, if cross coupling loss is 5% for each component adjacent to bitline $22_1$, a signal loss of 17.% (−4.5 times 5%) is experienced. In architecture 20, high coupling losses are experienced however coupling is less than the folded bitline architecture.

Referring to FIG. 5, another example of the twisted bitline architecture 20 includes memory cells 24 which all store "1"s, which are to be read simultaneously. Influences 28 are less since adjacent bitlines are affected by one half of the twisted bitlines and a more symmetric activation of pairs of bitlines provides local cancellations of capacitive coupling. During sensing in this arrangement, one bitline associated with a sense amplifier 26 goes up, and the other goes down, and charge is equally distributed to the next line and there is no net effect to the next adjacent bitline.

As indicated in FIG. 5, considering bitline $22_3$, cross-coupling influences 28 affect the data read from memory cell $24_3$ on bitline $22_3$. Surrounding components such as adjacent bitlines $22_1$ and $22_6$ as well as sense amplifier $26_3$, affect the signal on bitline $22_3$. Note that sense amplifier $26_3$ affects the signal on bitline $22_3$ due to sensing mismatches.

Referring to FIG. 6, an illustrative diagram is shown for quantifying the effects of surrounding components on a signal on bitline $22_3$. Each line labeled in FIG. 6 represents the effect on voltage that each corresponding component of FIG. 5 has on the signal on bitline $22_3$. Sense amplifier $26_2$ therefore sees a relative loss of −3.5 as indicated in box 25. This relative term is a multiplier, which represents a multiple of a coupling percent. A bar 27' is indicated showing the relative differential measured by sense amplifier $26_1$ due to the coupling effects and sensing mismatches. For example, if cross coupling loss is 5% for each component adjacent to bitline $22_1$, a signal loss of 17.5% (−3.5 times 5%) is experienced. Coupling is less for the loading shown in FIG. 5.

Referring to FIG. 7, a double twisted bitline architecture 30 is shown. Architecture 30 includes twisted bitline pairs, which preferably have different twist pitches in alternating pair positions, as shown. A signal on bitline $32_1$ is coupled to the second bitline $32_2$, which is connected to a sense amplifier $36_1$. The differential signal is reduced by a small amount only and due to the double twisting only a few influences 38 of cross-coupling are experienced, namely influences by bitlines $32_2$ and $32_3$. Sense amplifier $36_2$ influences are negligible.

Referring to FIG. 8, an illustrative diagram is shown for quantifying the effects of surrounding components on a signal on bitline $32_1$. Each line labeled in FIG. 8 represents the effect on voltage that each corresponding component of FIG. 7 has on the signal on bitline $32_1$. Sense amplifier $36_1$ therefore sees a relative loss of only −3.0, as indicated in box 35. This relative term is a multiplier, which represents a multiple of a coupling percent. This is independent of the data stored in memory cells 34 (FIG. 7). A bar 37 is indicated showing the relative differential measured by sense amplifier $36_1$ due to the coupling effects. For example, if cross coupling loss is 5% for each component adjacent to bitline $32_1$, a signal loss of only 15.0% (−3.0 times 5%) is experienced.

The above coupling % (e.g., 5%) is illustrative only and may be larger or smaller depending on the design.

Therefore, a need exists for an apparatus and method for reducing stray capacitance between bit lines to eliminate stray capacitance to improve the signal quality during sensing in memory arrays.

SUMMARY OF THE INVENTION

An architecture for bitlines in memory arrays, in accordance with the invention, includes a plurality of memory cells disposed in an array. A plurality of bitlines are included for reading and writing data to and from the memory cells. The plurality of bitlines include a first group of bitlines and a second group of bitlines. Each bitline of the first group is interposed between bitlines of the second group, and each bitline of the second group is interposed between bitlines of the first group. The first group of bitlines are active when the second group of bitlines are inactive, and the second group of bitlines are active when the first group of bitlines are inactive such that adjacent inactive bitlines provide a shield to prevent cross-coupling between active bitlines.

An architecture for bitlines in memory arrays, in accordance with the invention, includes a plurality of memory cells disposed in an array, and a plurality of wordlines extending through the array to enable access to the memory cells when the wordlines are enabled. A plurality of bitlines are included for reading and writing data to and from the memory cells when the wordlines are enabled. The plurality of bitlines include a first group of bitlines and a second group of bitlines. Each bitline of the first group is interposed between bitlines of the second group and each bitline of the second group is interposed between bitlines of the first group. A plurality of sense amplifiers are included wherein each sense amplifier is coupled to a bitline of the first group and a bitline of the second group on a first side of each sense amplifier, and each sense amplifier is further coupled to a bitline of the first group and a bitline of the second group on a second side of each sense amplifier. The first group of bitlines are active when the second group of bitlines are inactive, and the second group of bitlines are active when the first group of bitlines are inactive such that adjacent inactive bitlines provide a shield to prevent cross-coupling between active bitlines.

In alternate embodiments, the architecture may further include a plurality of sense amplifiers disposed in the array. Each sense amplifier is coupled to a bitline of the first group and a bitline of the second group on a first side of each sense amplifier, and each sense amplifier is further coupled to a bitline of the first group and a bitline of the second group on a second side of each sense amplifier. The architecture may include dummy lines, disposed in the array, for balancing capacitance in the plurality of sense amplifiers. The plurality of bitlines may include switches to activate and deactivate the plurality of bitlines. The switches may include field effect transistors. The switches may include first switches associated with the first group of bitlines and second switches associated with the second group of bitlines. The first switches are switched by a first signal line and the second switches are switched by a second signal line. The architecture may include a folded bitline architecture. The inactive bitlines may include a floating potential. The first switches are switched by a first signal line, and the second switches are switched by a second signal line.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 1 is a schematic diagram of a folded bitline architecture showing coupling influences on a bitline in accordance with the prior art;

FIG. 2 is a plot of the influences shown in FIG. 1, which is employed to determine a coupling influence multiplier for the prior art architecture as seen from an amplifier sensing the bitline;

FIG. 3 is a schematic diagram of a twisted bitline architecture showing coupling influences on a bitline in accordance with the prior art;

FIG. 4 is a plot of the influences shown in FIG. 3, which is employed to determine a coupling influence multiplier for the prior art architecture as seen from an amplifier sensing the bitline;

FIG. 5 is a schematic diagram of the twisted bitline architecture of FIG. 3 showing coupling influences on a bitline with different data stored in the selected memory cells in accordance with the prior art;

FIG. 6 is a plot of the influences shown in FIG. 5, which is employed to determine a coupling influence multiplier for the prior art architecture as seen from an amplifier sensing the bitline;

FIG. 7 is a schematic diagram of a double twisted bitline architecture showing coupling influences on a bitline in accordance with the prior art;

FIG. 8 is a plot of the influences shown in FIG. 7, which is employed to determine a coupling influence multiplier for the prior art architecture as seen from an amplifier sensing the bitline;

FIG. 10 is a schematic diagram of a bitline architecture showing coupling influences on a bitline in accordance with the present invention; and FIG. 11 is a plot of the influences shown in FIG. 10, which is employed to determine a coupling influence multiplier for the architecture as seen from an amplifier sensing the bitline, in accordance with the present invention.

DETAILED DESCRIPTION OF PREFERRED EMBODIMENTS

Figure 9:
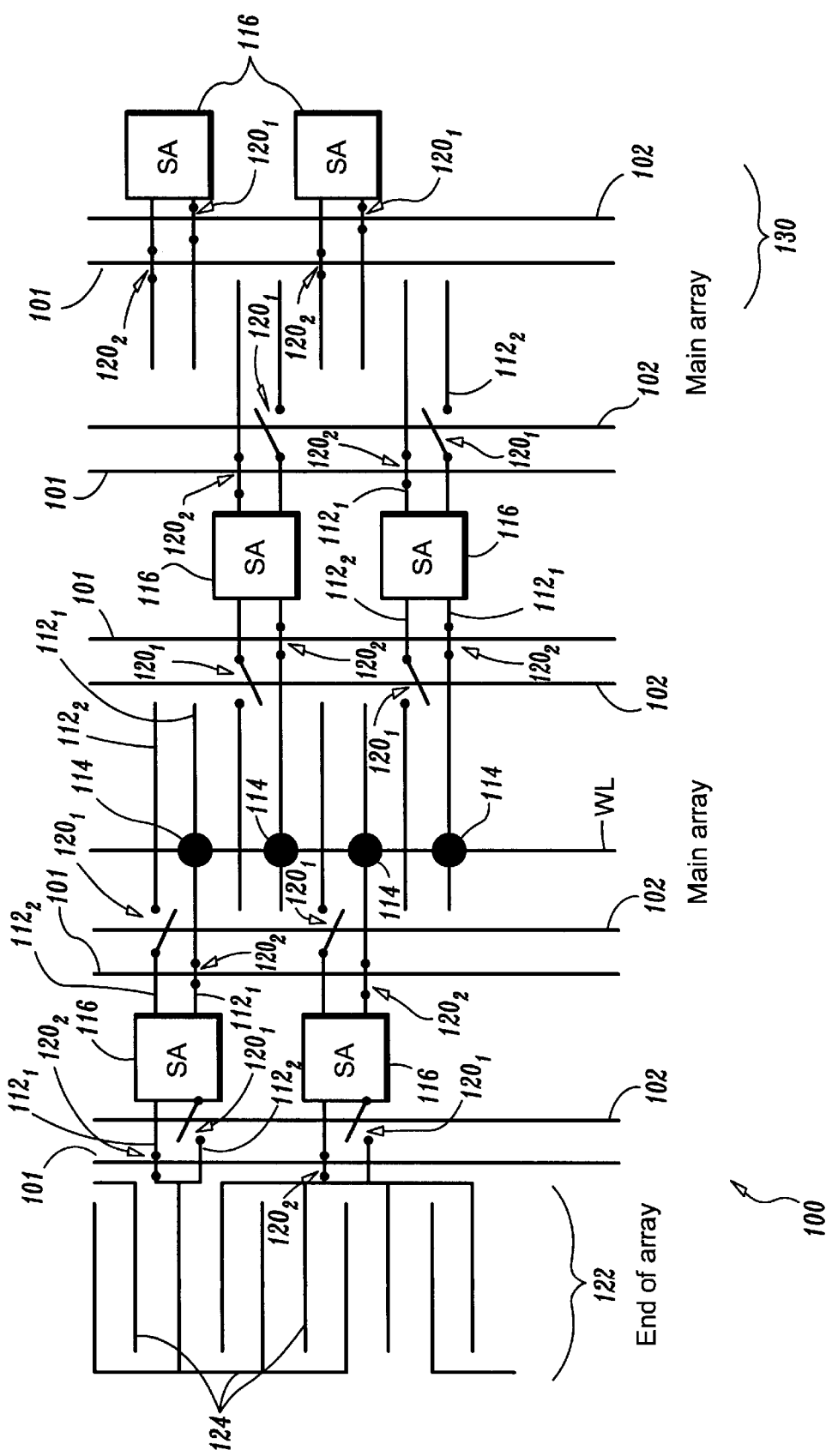
FIG. 9 is a schematic diagram showing an architecture for bitlines in accordance with an illustrative embodiment of the present invention.

The present invention provides a bitline architecture for memory arrays, which significantly reduces stray capacitances between active bitlines due to adjacent components. When a signal is read out of a memory cell, the stray capacitance between bit lines reduces the signal. The present invention provides an architecture to eliminate the stray capacitances and to improve the signal quality during sensing.

Referring now in specific detail to the drawings in which like reference numerals identify similar or identical elements throughout the several views, and initially to FIG. 9, a schematic diagram is shown depicting one illustrative embodiment of the present invention. An architecture 100 of the present invention may be included in memory arrays, of for example, dynamic random access memories (DRAMS), application specific memory devices, or any other device having an array of lines which experience cross-coupling. Architecture 100 includes a plurality of memory cells 114 of which only a few selected memory cells 114 are shown for simplicity. Memory cells 114 may include an access transistor and a storage capacitor (both not shown). The access transistor of each memory cell 114 is enabled to permit conduction to charge or discharge the storage capacitor by a wordline (WL). Data is read from memory cells 114 to bitlines 112 or read from bitlines 112 to memory cells 114.

In accordance with the present invention, a plurality of sense amplifiers 116 are employed which connect to only two bitlines 112 at any given time. Bitlines $112_1$ are shown connected to sense amplifiers 116. To have equally balanced sense amplifiers (SA) 116, two bitlines $112_1$ are connected to a SA 116 at a time. In FIG. 9, one bitline $112_1$ is connected on the right side of sense amplifier 116 and another bitline $112_1$ is connected on the left side of sense amplifier 116. Bitlines $112_2$ are disconnected from sense amplifiers 116 when bitlines $112_1$ are connected. Bitlines $112_1$ and $112_2$ are connected and disconnected from sense amplifiers 116, preferably by switches 120. Switches 120 preferably include field effect transistors, which are enabled and disabled (e.g., closed and opened) in accordance with lines 101 and 102. Lines 101 and 102 select which bitlines $112_1$ and $112_2$, respectively, to connect to sense amplifiers 116. Lines 101 and 102 may be controlled by a multiplexer (MUX) signal and distributed to lines 101 and 102 such that when the MUX signal is a first value, a first set of switches (e.g., $120_1$) are closed and when the MUX signal has a second value a second set of switches (e.g., $120_2$) are closed. The MUX signal will alternate to alternately open and close the two set of switches.

In operation, memory cells 114 of the memory array are activated via word lines (WL). Every bit line 112 is adjacent to inactive bitlines. For example, when switches $120_1$ are closed bitlines $112_1$ are active, and bitlines $112_2$ are inactive. Inactive bitlines ($112_2$ in this case) may float, that is, they may be permitted to have any voltage or current state or the inactive bitlines may be tied to a known potential, for example, the inactive bitlines may be tied to a Vbleq level, via circuits not shown here. Vbleq is a bitline equalizer voltage, which is common to memory devices and is known in the art.

Advantageously, the inactive bitlines shield the active lines so that no capacitive coupling between active lines will occur. In addition, since coupling losses are minimized, sense amplifiers 116 get the full signal read out of memory cells 114.

To have equally balanced sense amplifiers (SA), two bitlines are connected to sense amplifiers 116 at a time. To get the benefit of eliminating the capacitance coupling between active lines, an area penalty may have to be paid. For example, lines 101 and 102 consume a small amount of space. In addition, since sense amplifiers 116 have disconnected bitlines, capacitance matching is needed. To match the capacitances of inactive bitlines, in one embodiment, an area 122 may be provided, preferably at an end of an array. To balance sense amplifiers 116 at the end of the array, dummy lines 124 are introduced. These lines should represent a length of the disconnected inactive bitlines. To get the same length of inactive bitlines, lines 124 consume an area of a ¼ of a regular array. If there is a continuous array of 8 blocks, for example, two additional ¼ arrays have to be added. Each one at the end of the array. This correlates to, perhaps, a 7% area penalty. Other arrangements of dummy lines 124 may be provided to reduce the area penalty further. An inactive memory bank 130 is also shown.

Referring to FIG. 10, a layout of a folded bitline architecture 200 is shown in accordance with the present invention. Architecture 200 includes a plurality of sense amplifiers (SA) 216 each for sensing two bitlines $212_1$ and $212_2$. Bitlines $212_1$ are shown disconnected from sense amplifiers 216 in accordance with the invention. At a later time bitlines $212_1$ will be connected to sense amplifiers 216 and bitlines $212_2$ will be disconnected. This is preferably performed by employing switches 120 (as shown in FIG. 9). In this way, at any given time inactive bitlines will be disposed between active bitlines. Memory cells 214 store data. Advantageously, the data stored in memory cells 214 is not material to the implementation of the invention.

During a read, a cell signal on bitline $212_2$' is only slightly influenced by cross-coupling to both adjacent bit lines $212_1$' and $212_1$". Influences are shown by arrows 228. Sensing mismatch from sense amplifiers is negligible in this architecture due to short shared lines.

Referring to FIG. 11, an illustrative diagram is shown for quantifying the effects of surrounding components on a signal on bitline $212_2$'. Each line labeled in FIG. 11 represents the effect on voltage that each corresponding component of FIG. 10 has on the signal on bitline $212_2$'. Sense amplifier $216_1$ advantageously sees a relative loss of only −2.0, indicted in box 229. This relative term is a multiplier, which represents a multiple of a coupling percent. A bar 217 is indicated showing the relative differential measured by sense amplifier $216_1$ due to the coupling effects and sensing mismatches. For example, if cross coupling loss is 5% for each component adjacent to bitline $212_2$', a signal loss of only 10.% (−2.0 times 5%) is experienced. Stray capacitance losses from the signals read from memory cells is advantageously reduced by 33% over the double twisted bitline architecture as described above.

The present invention has been illustratively presented in terms of a folded bit line architecture; however, other architectures may be employed which can benefit by the present invention.

Having described preferred embodiments for a shielded bit line architecture for memory arrays (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A memory array comprising:

a plurality of memory cells;

a plurality of bitlines for reading and writing data to and from the memory cells, the plurality of bitlines including a first group of bitlines and a second group of bitlines, each bitline of the first group being interposed between bitlines of the second group and each bitline of the second group being interposed between bitlines of the first group;

at least one switch disposed along a length of each bitline to connect and disconnect the bitline to and from a sense amplifier to activate and deactivate the bitlines wherein the first group of bitlines are active when the second group of bitlines are inactive and the second group of bitlines are active when the first group of bitlines are inactive such that adjacent inactive bitlines provide a shield to prevent cross-coupling between active bitlines; and a plurality of sense amplifiers, each sense amplifier being coupled to a bitline of the first group and a bitline of the second group on a first side of each sense amplifier, and each sense amplifier being coupled to a bitline of the first group and a bitline of the second group on a second side of each sense amplifier.

2. The memory array as recited in claim 1, further comprising dummy lines disposed in the array for balancing capacitance in the plurality of sense amplifiers.

3. The memory array as recited in claim 1, wherein the switches include field effect transistors.

4. The memory array as recited in claim 1, wherein the switches include first switches associated with the first group of bitlines and second switches associated with the second group of bitlines, the first switches being switched by a first signal line and the second switches being switched by a second signal line.

5. The memory array as recited in claim 1, wherein the memory array includes a folded bitline architecture.

6. The memory array as recited in claim 1, wherein inactive bitlines include a floating potential.

7. An memory array comprising:

a plurality of memory cells disposed in an array;

a plurality of wordlines extending through the array to enable access to the memory cells when the wordlines are enabled;

a plurality of bitlines for reading and writing data to and from the memory cells when the wordlines are enabled, the plurality of bitlines including a first group of bitlines and a second group of bitlines, each bitline of the first group being interposed between bitlines of the second group and each bitline of the second group being interposed between bitlines of the first group; and a plurality of sense amplifiers, each sense amplifier being coupled to a bitline of the first group and a bitline of the second group on a first side of each sense amplifier, and each sense amplifier being coupled to a bitline of the first group and a bitline of the second group on a second side of each sense amplifier, the first group of bitlines being active when the second group of bitlines are inactive and the second group of bitlines being active when the first group of bitlines are inactive such that adjacent inactive bitlines provide a shield to prevent cross-coupling between active bitlines.

8. The memory array as recited in claim 7, further comprising dummy lines disposed at an end of the array for balancing capacitance in the plurality of sense amplifiers.

9. The memory array as recited in claim 7, wherein the plurality bitlines include switches to activate and deactivate the plurality of bitlines.

10. The memory array as recited in claim 9, wherein the switches include field effect transistors.

11. The memory array as recited in claim 9, wherein the switches include first switches associated with the first group of bitlines and second switches associated with the second group of bitlines, the first switches being switched by a first signal line and the second switches being switched by a second signal line.

12. The memory array as recited in claim 7, wherein the memory array includes a folded bitline architecture.

13. The memory array as recited in claim 7, wherein the inactive bitlines include a floating potential.

14. An architecture for bitlines for memory arrays comprising:

a plurality of memory cells disposed in an array;

a plurality of wordlines extending through the array to enable access to the memory cells when the wordlines are enabled;

a plurality of bitlines for reading and writing data to and from the memory cells when the wordlines are enabled, the plurality of bitlines including:

a first group of bitlines and a second group of bitlines, each bitline of the first group being interposed between bitlines of the second group and each bitline of the second group being interposed between bitlines of the first group; and each of the plurality of bitlines including a switch for activating and deactivating each bitline; and a plurality of sense amplifiers, each sense amplifier being coupled to a bitline of the first group and a bitline of the second group on a first side of each sense amplifier, and each sense amplifier being coupled to a bitline of the first group and a bitline of the second group on a second side of each sense amplifier, the first group of bitlines being active when the second group of bitlines are inactive and the second group of bitlines being active when the first group of bitlines are inactive such that adjacent inactive bitlines provide a shield to prevent cross-coupling between active bitlines.

15. The architecture as recited in claim 14, further comprising dummy lines, disposed at an end of the array, for balancing capacitance in the plurality of sense amplifiers.

16. The architecture as recited in claim 14, wherein the switches include first switches associated with the first group of bitlines and second switches associated with the second group of bitlines, the first switches being switched by a first signal line and the second switches being switched by a second signal line.

17. The architecture as recited in claim 14, wherein the architecture includes a folded bitline architecture.

18. The architecture as recited in claim 14, wherein the switches include field effect transistors.

19. The architecture as recited in claim 14, wherein the inactive bitlines include a floating potential.

* * * * *